United States Patent
Hsieh et al.

(10) Patent No.: US 12,114,508 B2
(45) Date of Patent: Oct. 8, 2024

(54) SEMICONDUCTOR DEVICE AND METHOD FOR FABRICATING THE SAME

(71) Applicant: UNITED MICROELECTRONICS CORP., Hsin-Chu (TW)

(72) Inventors: Po-Kuang Hsieh, Kaohsiung (TW); Shih-Hung Tsai, Tainan (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 416 days.

(21) Appl. No.: 17/548,607

(22) Filed: Dec. 13, 2021

(65) Prior Publication Data
US 2023/0157029 A1    May 18, 2023

(30) Foreign Application Priority Data
Nov. 12, 2021  (CN) .......................... 202111338520.X

(51) Int. Cl.
*H10B 53/30*      (2023.01)

(52) U.S. Cl.
CPC ................................. *H10B 53/30* (2023.02)

(58) Field of Classification Search
CPC ..... H01L 28/60; H01L 28/55; H01L 21/0332; H01L 29/7827; H01L 21/76885; H01L 21/31144; H01L 29/66545; H01L 21/76804; H01L 21/76802; H01L 29/0649; H01L 21/0337; H01L 21/02326; H01L 28/90; H01L 21/76826; H01L 28/91; H01L 28/84; H01L 29/4236; H01L 23/5383; H01L 25/0652; H01L 23/5223; H01L 25/0657; H01L 23/481; H01L 23/642; H01L 23/5286; H01L 23/49816; H01L 23/5384; H01L 2225/06527; H10B 53/30; H10B 43/27; H10B 99/00; H10B 12/033; H10B 12/31; H10B 12/053
USPC ............... 257/295, 296, 310, 306, 308, 758, 257/21.664, 27.104, 21.001, 29.345; 438/3, 244, 387, 253
See application file for complete search history.

(56) References Cited

U.S. PATENT DOCUMENTS

| | | | | |
|---|---|---|---|---|
| 5,258,649 A * | 11/1993 | Tanaka | ................... | H05K 3/325 |
| | | | | 257/796 |
| 6,111,285 A * | 8/2000 | Al-Shareef | ............. | H01L 28/60 |
| | | | | 257/296 |
| 6,194,758 B1 * | 2/2001 | Tanaka | ................... | H10B 12/09 |
| | | | | 257/532 |
| 6,509,277 B1 * | 1/2003 | Saito | ................. | H01L 21/02337 |
| | | | | 438/723 |

(Continued)

OTHER PUBLICATIONS

Jae Hur, Title: A Technology Path for Scaling Embedded FeRAM to 28nm with 2T1C Structure; 2021 IEEE International Memory Workshop, Jul. 13, 2021.

*Primary Examiner* — Mouloucoulaye Inoussa
(74) *Attorney, Agent, or Firm* — Winston Hsu

(57) ABSTRACT

A method for fabricating a semiconductor device includes the steps of forming a first inter-metal dielectric (IMD) layer on a substrate, forming a first trench and a second trench in the first IMD layer, forming a bottom electrode in the first trench and the second trench, forming a ferroelectric (FE) layer on the bottom electrode, and then forming a top electrode on the FE layer to form a ferroelectric random access memory (FeRAM).

12 Claims, 3 Drawing Sheets

(56) References Cited

U.S. PATENT DOCUMENTS

| | | | | |
|---|---|---|---|---|
| 6,576,509 B1* | 6/2003 | Toyokawa | H01L 21/76877 | 257/E21.507 |
| 9,589,964 B1* | 3/2017 | Lim | H10B 12/033 | |
| 10,403,815 B2 | 9/2019 | Ino | | |
| 11,411,071 B1* | 8/2022 | Li | H01L 28/91 | |
| 11,784,215 B2* | 10/2023 | Kim | H01L 24/81 | 257/668 |
| 2001/0050386 A1* | 12/2001 | Suzuki | H01L 21/76838 | 257/E21.507 |
| 2002/0043680 A1* | 4/2002 | Yamada | H10B 12/485 | 257/E21.018 |
| 2002/0096701 A1* | 7/2002 | Torii | H10B 12/0335 | 257/E21.589 |
| 2002/0109231 A1* | 8/2002 | Chu | H01L 28/60 | 257/E21.59 |
| 2002/0135010 A1* | 9/2002 | Sheu | H01L 21/76897 | 257/E21.507 |
| 2002/0192902 A1* | 12/2002 | Kimura | H10B 12/50 | 257/E21.018 |
| 2003/0047770 A1* | 3/2003 | Shih | H01L 28/75 | 257/306 |
| 2003/0178658 A1* | 9/2003 | Shinkawata | H01L 21/76897 | 257/E21.507 |
| 2004/0094791 A1* | 5/2004 | Ito | H01L 28/55 | 257/295 |
| 2005/0006685 A1* | 1/2005 | Natsume | H01L 28/65 | 257/E21.018 |
| 2005/0170599 A1* | 8/2005 | Joo | H01L 28/91 | 257/E21.648 |
| 2005/0285170 A1* | 12/2005 | Mikawa | H10B 53/00 | 257/E21.018 |
| 2006/0038217 A1* | 2/2006 | Mikawa | H01L 28/91 | 257/532 |
| 2007/0018224 A1* | 1/2007 | Tu | H01L 28/60 | 257/532 |
| 2007/0284636 A1* | 12/2007 | Noma | H01L 28/91 | 257/E29.345 |
| 2007/0287249 A1* | 12/2007 | Yoshida | H01L 28/55 | 438/387 |
| 2012/0061800 A1* | 3/2012 | Hirota | H01L 28/75 | 257/532 |
| 2012/0187410 A1* | 7/2012 | Yamazaki | H10B 12/00 | 257/66 |
| 2016/0064391 A1* | 3/2016 | Li | H10B 53/30 | 257/295 |
| 2016/0233343 A1* | 8/2016 | Miyairi | H01L 29/78696 | |
| 2016/0311217 A1* | 10/2016 | Tseng | B30B 15/0052 | |
| 2017/0033111 A1* | 2/2017 | Yamazaki | H01L 29/7869 | |
| 2017/0358582 A1* | 12/2017 | Zhou | H10B 12/50 | |
| 2018/0226470 A1* | 8/2018 | Lin | H10B 12/033 | |
| 2020/0027982 A1* | 1/2020 | Iwaki | H01L 21/0332 | |
| 2021/0005610 A1* | 1/2021 | Lu | H01G 4/228 | |
| 2021/0118794 A1* | 4/2021 | Ding | H01L 28/60 | |
| 2021/0391343 A1* | 12/2021 | Mutch | H10B 53/10 | |
| 2022/0028827 A1* | 1/2022 | Ding | H01L 23/5383 | |
| 2022/0199759 A1* | 6/2022 | Chyi Liu | H01L 21/76805 | |
| 2022/0328346 A1* | 10/2022 | Lai | H01L 21/76877 | |

* cited by examiner

SEMICONDUCTOR DEVICE AND METHOD FOR FABRICATING THE SAME

BACKGROUND OF THE INVENTION

1. Field of the Invention

The invention relates to a method of fabricating a semiconductor device, and more particularly to a method for fabricating a ferroelectric random access memory (FeRAM).

2. Description of the Prior Art

In efforts to improve memory arrays, field effect transistors with ferroelectric gates or ferroelectric field effect transistors (FeFETs) have been recently in the focus of research. In general, ferroelectric materials have dielectric crystals which show a spontaneous electric polarization similar to ferromagnetic materials showing a spontaneous magnetization. Upon applying an appropriate external electric field to a ferroelectric material, the direction of polarization can be reoriented. The basic idea is to use the direction of spontaneous polarization in ferroelectric memories for storing digital bits. In FeFETs, the effect that one makes use of is the possibility to adjust the polarization state of a ferroelectric material on the basis of appropriate electrical fields which are applied to the ferroelectric material which, in a FeFET, is usually the gate oxide. Since the polarization state of a ferroelectric material is preserved unless it is exposed to a high, with regard to the polarization state, counter-oriented electrical field or a high temperature, it is possible to "program" a capacitor formed of ferroelectric material such that an induced polarization state reflects an information unit. Therefore, an induced polarization state is preserved, even upon removing an accordingly "programmed" device from a power supply. In this way, FeFETs allow the implementation of non-volatile electrically-switchable data storage devices.

On the basis of ferroelectric materials, it is possible to provide non-volatile memory devices, particularly random-access memory devices similar in construction to DRAM devices, but differing in using a ferroelectric layer instead of a dielectric layer such that non-volatility is achieved. For example, the 1T-1C storage cell design in a FeRAM is similar in construction to the storage cell in widely used DRAM in that both cell types include one capacitor and one access transistor—a linear dielectric is used in a DRAM cell capacitor, whereas, in a FeRAM cell capacitor, the dielectric structure includes a ferroelectric material. Other types of FeRAMs are realized as 1T storage cells which consist of a single FeFET employing a ferroelectric dielectric instead of the gate dielectric of common MOSFETs. The current-voltage characteristic between source and drain of a FeFET depends in general on the electric polarization of the ferroelectric dielectric, i.e., the FeFET is in the on- or off-state, depending on the orientation of the electric polarization state of the ferroelectric dielectric. Writing of a FeFET is achieved in applying a writing voltage to the gate relative to source, while a 1T-FeRAM is read out by measuring the current upon applying a voltage to source and drain. It is noted that reading out of a 1T-FeRAM is non-destructive.

A means of optimizing FeFETs and FeRAMs is to minimize the sizes of these elements, however, the complexity and cost for integrating and reducing the size of these elements also increases accordingly. Hence, how to lower cost while keeping performance of the device has become an important task in this field.

SUMMARY OF THE INVENTION

According to an embodiment of the present invention, a method for fabricating a semiconductor device includes the steps of forming a first inter-metal dielectric (IMD) layer on a substrate, forming a first trench and a second trench in the first IMD layer, forming a bottom electrode in the first trench and the second trench, forming a ferroelectric (FE) layer on the bottom electrode, and then forming a top electrode on the FE layer to form a ferroelectric random access memory (FeRAM).

According to another aspect of the present invention, a semiconductor device includes an inter-metal dielectric (IMD) layer on a substrate and a ferroelectric random access memory (FeRAM) on the ILD layer. Preferably, the FeRAM includes a first trench and a second trench in the IMD layer, a bottom electrode in the first trench and the second trench, a ferroelectric (FE) layer on the bottom electrode, and a top electrode on the FE layer.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "connect", "couple" and "couples" are intended to mean either an indirect or a direct electrical connection. Thus, if a first device couples to a second device, that connection may be through a direct electrical connection, or through an indirect electrical connection via other devices and connections.

Figure 1:
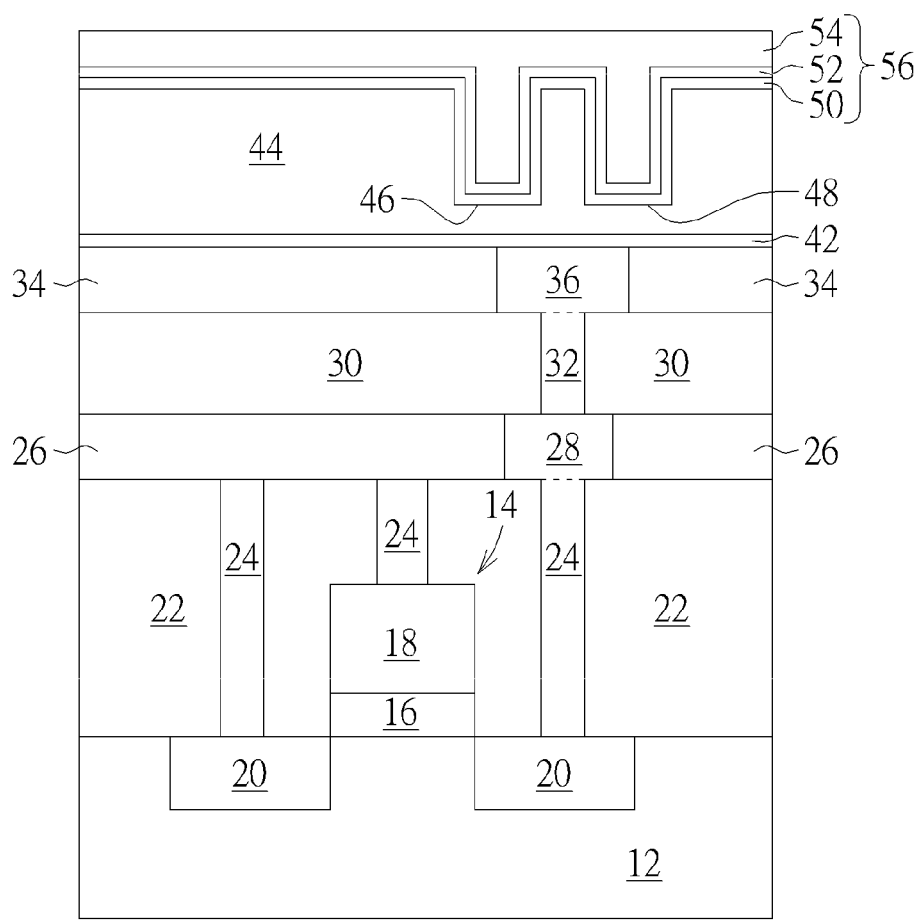
FIGS. 1-3 illustrate a method for fabricating a semiconductor device according to an embodiment of the present invention.
Figure 2:
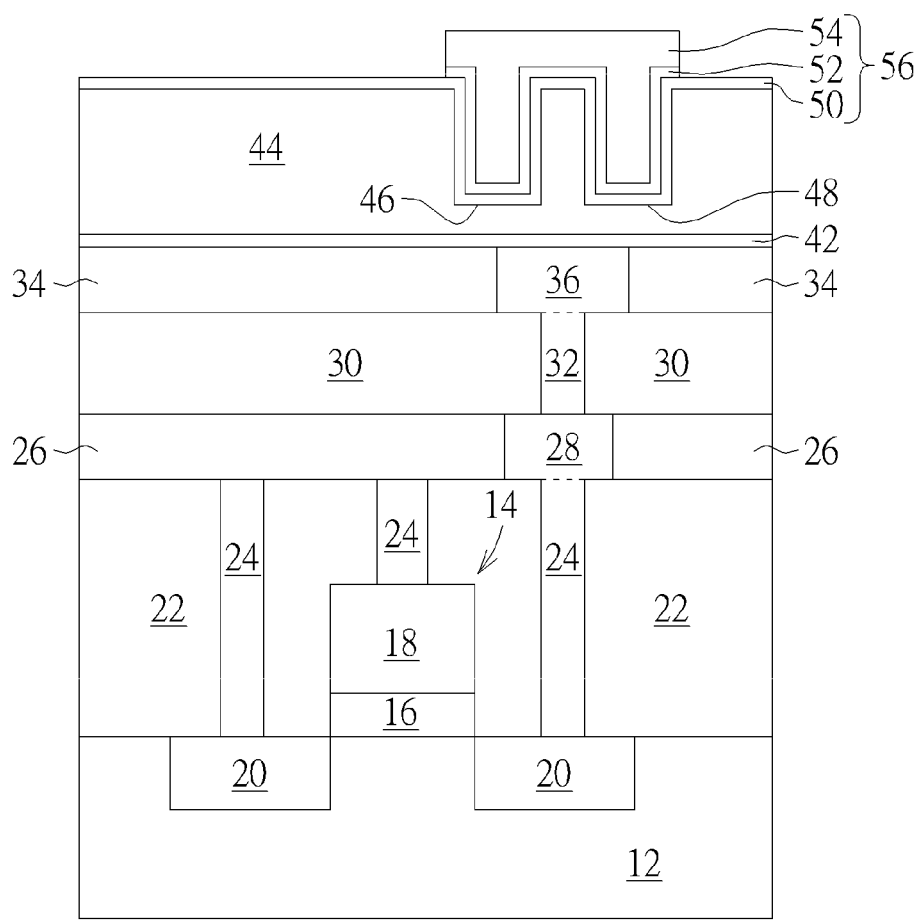
Figure 3:
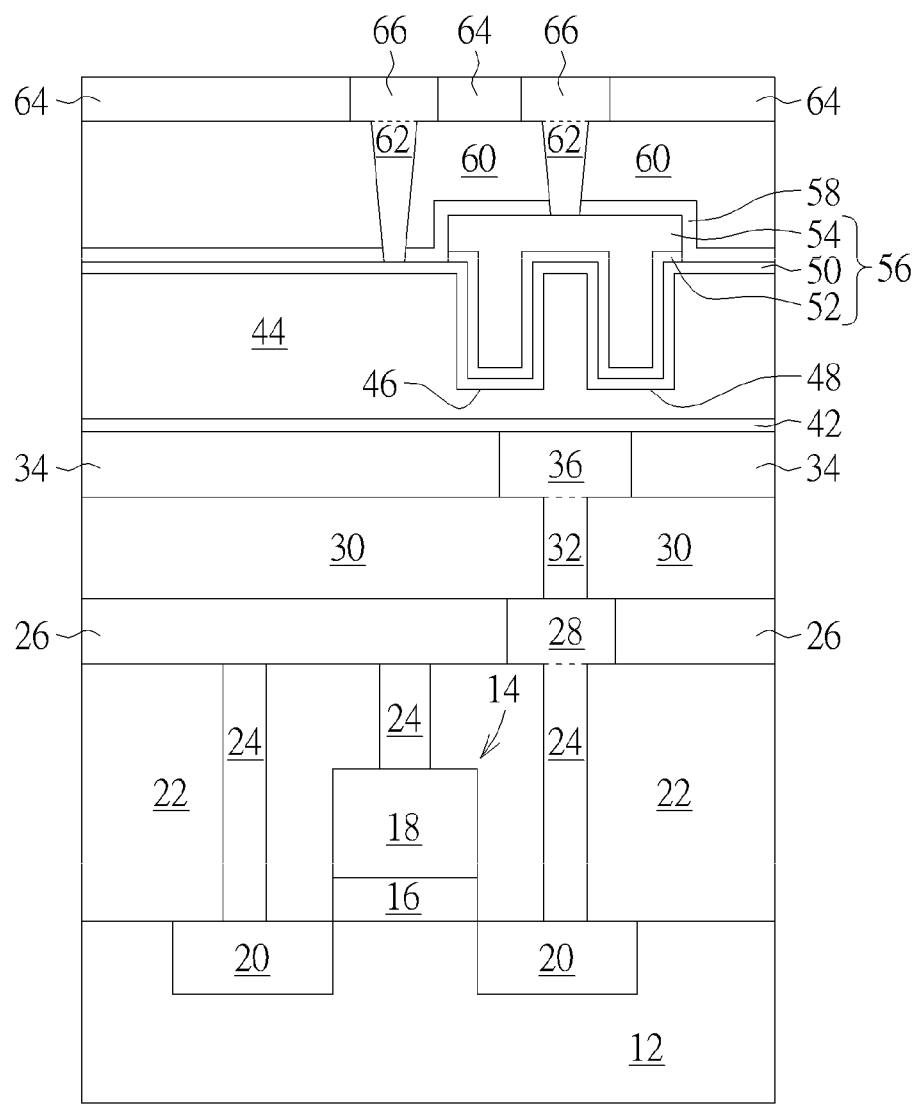

Referring to FIGS. 1-3, FIGS. 1-3 illustrate a method for fabricating a semiconductor device or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs). Active devices such as metal-oxide semiconductor (MOS) transistors, passive devices, conductive layers, and interlayer dielectric (ILD) layer could also be formed on top of the substrate 12. More specifically, at least a planar MOS transistor or non-planar (such as FinFETs) MOS transistors could be formed on the substrate 12, in which the MOS transistors could include transistor elements such as a gate dielectric layer 16, a gate electrode (such as metal gate) 18, source/drain regions 20, spacers, epitaxial layers, and a contact etch stop layer (CESL). An ILD layer 22 could be formed on the substrate 12 to cover the MOS transistors, and a plurality of contact plugs 24 could be formed in the ILD layer 22 to electrically connect to the gate electrodes 18 and/or source/drain region 20 of MOS transistors. Since the fabrication of planar or non-planar transistors and ILD layer is well known to those skilled in the art, the details of which are not explained herein for the sake of brevity.

Next, at least a metal interconnect structure is formed on the ILD layer 22 to electrically connect the contact plugs 24, in which the metal interconnect structure could include an inter-metal dielectric (IMD) layer 26 disposed on the ILD layer 22, at least a metal interconnection 28 embedded in the IMD layer 26, an IMD layer 30 disposed on the IMD layer 26, at least a metal interconnection 32 such as via conductor embedded in the IMD layer 30, an IMD layer 34 disposed on the IMD layer 30, and at least a metal interconnection 36 embedded in the IMD layer 34. Preferably, the metal interconnection 28 made of trench conductor could be referred as a first level metal interconnection and the metal interconnection 36 also made of trench conductor could be referred to as a second level metal interconnection.

Preferably, each of the metal interconnections 28, 32, 36 could be embedded within the IMD layers 26, 30, 34 according to a single damascene process or dual damascene process. For instance, each of the metal interconnections 28, 32, 36 could further includes a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. Moreover, the metal layer within the metal interconnections 28, 32, 36 preferably includes copper and the IMD layers 26, 30, 34 could include silicon oxide such as tetraethyl orthosilicate (TEOS) or ultra low-k (ULK) dielectric layers including but not limited to for example porous material or silicon oxycarbide (SiOC) or carbon doped silicon oxide (SiOCH).

Next, a stop layer 42 and an IMD layer 44 are formed on the IMD layer 34, and a photo-etching process is conducted to remove part of the IMD layer 44 for forming at least two trenches including a trench 46 and a trench 48 in the IMD layer 44. Next, a bottom electrode 50 is formed in the trenches 46, 48 without filling the trenches 46, 48 completely, a ferroelectric (FE) layer 52 is formed on the bottom electrode 50, and a top electrode 54 is formed on the FE layer 52 to fill the trenches 46, 48 completely. Next, a selective anneal process such as a rapid thermal anneal (RTA) process could be conducted on the FE layer 52 for a phase change. Preferably, the anneal process is conducted at a temperature equal to or less than 400° C. and a duration of the anneal process 84 is between 25-35 seconds or most preferably at 30 seconds.

Next, as shown in FIG. 2, a pattern transfer process is conducted to pattern the top electrode 54 and the FE layer 52. For instance, a patterned mask (not shown) such as a patterned resist could be formed on the top electrode 54, and an etching process is conducted by using the patterned mask as mask to remove part of the top electrode 54 and part of the FE layer 52 but not removing any of the bottom electrode 50 so that sidewalls of the remaining top electrode 54 are aligned with sidewalls of the remaining FE layer 52 while the un-etched bottom electrode 50 still covers the surface of the IMD layer 44 entirely. At this stage the un-patterned bottom electrode 50 and the patterned FE layer 52 and top electrode 54 preferably constitute a FeRAM 56.

In this embodiment, the bottom electrode 50 and the top electrode 54 are made of conductive material such as titanium nitride (TiN). The FE layer 52 preferably includes $HfZrO_2$, nevertheless, according to other embodiments of the present invention, the FE layer 52 could also include a material selected from the group consisting of lead zirconate titanate ($bZrTiO_3$, PZT), lead lanthanum zirconate titanate ($PbLa(TiZr)O_3$, PLZT), strontium bismuth tantalate ($SrBiTa_2O_9$, SBT), bismuth lanthanum titanate ($(BiLa)_4Ti_3O_{12}$, BLT), and barium strontium titanate ($BaSrTiO_3$, BST).

Moreover, in this embodiment, the bottom electrode 50 includes a thickness between 5-15 Angstroms or most preferably 10 Angstroms, the FE layer 52 includes a thickness between 5-15 Angstroms or most preferably 10 Angstroms, and the top electrode 54 includes a thickness between 30-40 Angstroms or most preferably 35 Angstroms. The IMD layer 44 could include silicon oxide such as tetraethyl orthosilicate (TEOS) or ultra low-k (ULK) dielectric layers including but not limited to for example porous material or silicon oxycarbide (SiOC) or carbon doped silicon oxide (SiOCH).

Next, as shown in FIG. 3, a selective photo-etching process could be conducted to remove part of the bottom electrode 50 for defining the area occupied by the FeRAM 56 so that the bottom electrode 50 does not extend throughout the entire stop layer 42. Next, a hard mask 58 is formed on the FeRAM 56, an IMD layer 60 is formed on the hard mask 58, at least a metal interconnection 62 such as via conductors are formed in the IMD layer 60 to electrically connect to the bottom electrode 50 and the top electrode 54 of the FeRAM 56, another IMD layer 64 is formed on the IMD layer 60, and then metal interconnections 66 such as trench conductors are formed in the IMD layer 64 to electrically connect to the metal interconnections 62 underneath. Similar to the aforementioned embodiment, each of the metal interconnections 62, 66 could be interconnected to each other and embedded within the IMD layers 60, 64 according to a single damascene process or dual damascene process. Moreover, the metal interconnections 62, 66 preferably include copper and the IMD layers 60, 64 could include silicon oxide such as tetraethyl orthosilicate (TEOS) or ultra low-k (ULK) dielectric layers including but not limited to for example porous material or silicon oxycarbide (SiOC) or carbon doped silicon oxide (SiOCH). This completes the fabrication of a semiconductor device according to an embodiment of the present invention.

Referring again to FIG. 3, FIG. 3 further illustrates a structural view of a semiconductor device according to an embodiment of the present invention. As shown in FIG. 3, the semiconductor device preferably includes an IMD layer 44 disposed on the substrate 12 and at least a FeRAM 56 disposed on the IMD layer 44, in which the FeRAM 56 includes at least two trenches such as the trenches 46, 48 in the IMD layer 44, a bottom electrode 50 disposed in the trenches 46, 48, a FE layer 52 disposed on the bottom electrode 50, and a top electrode 54 disposed on the FE layer 52.

Moreover, a hard mask 58 is disposed on the FeRAM 56, IMD layers 60, 64 are disposed on the hard mask 56, and metal interconnections 62, 66 are disposed in the IMD layers 60, 64 to connect the bottom electrode 50 and the top electrode 54 respectively, in which the metal interconnection 62 on the left contacts the bottom electrode 50 directly while the metal interconnection 62 on the right contacts the top electrode 54 directly. It should be noted that the bottom of the FeRAM 56 disposed in the two trenches 46, 48 preferably not contacting the lower level metal interconnection 36 directly as the bottom electrode 50 and the top electrode 54 are connected to external devices through the upper level or metal interconnections 62 on the top.

Overall, the present invention preferably discloses an improved FeRAM structure in that at least two trenches or more than two trenches are first formed in an IMD layer, and then elements including bottom electrode, FE layer, and top electrode are formed in the trenches and a patterning process is conducted to form a FeRAM. By following the aforementioned approach to fabricate FeRAM it would be desirable increase the capacitance of the device significantly and improve power distribution network (PDN) and spike noise of LC circuit at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   forming a first inter-metal dielectric (IMD) layer on a substrate;
   forming a first trench and a second trench in the first IMD layer, wherein bottom surfaces of the first trench and the second trench expose the first IMD layer;
   forming a bottom electrode in the first trench and the second trench;
   forming a ferroelectric (FE) layer on the bottom electrode; and
   forming a top electrode on the FE layer to form a ferroelectric random access memory (FeRAM).

2. The method of claim 1, further comprising:
   patterning the top electrode and the FE layer;
   forming a hard mask on the FeRAM;
   forming a second IMD layer on the hard mask; and
   forming a first metal interconnection and a second metal interconnection in the second IMD layer.

3. The method of claim 2, further comprising forming the hard mask on the bottom electrode and the top electrode.

4. The method of claim 2, wherein the first metal interconnection connects the top electrode.

5. The method of claim 2, wherein the second metal interconnection connects the bottom electrode.

6. The method of claim 1, wherein a sidewall of the top electrode is aligned with a sidewall of the FE layer.

7. A semiconductor device, comprising:
   an inter-metal dielectric (IMD) layer on a substrate; and
   a ferroelectric random access memory (FeRAM) on the ILD layer, wherein the FeRAM comprises:
   a first trench and a second trench in the IMD layer, wherein bottom surfaces of the first trench and the second trench expose the first IMD layer;
   a bottom electrode in the first trench and the second trench;
   a ferroelectric (FE) layer on the bottom electrode; and
   a top electrode on the FE layer.

8. The semiconductor device of claim 7, further comprising:
   a hard mask on the FeRAM;
   a second IMD layer on the hard mask; and
   a first metal interconnection and a second metal interconnection in the second IMD layer.

9. The semiconductor device of claim 8, wherein the hard mask is on the bottom electrode and the top electrode.

10. The semiconductor device of claim 8, wherein the first metal interconnection connects the top electrode.

11. The semiconductor device of claim 8, wherein the second metal interconnection connects the bottom electrode.

12. The semiconductor device of claim 7, wherein a sidewall of the top electrode is aligned with a sidewall of the FE layer.

* * * * *